(12) United States Patent
Du et al.

(10) Patent No.: US 11,309,358 B2
(45) Date of Patent: Apr. 19, 2022

(54) DISPLAY SUBSTRATE AND MANUFACTURING METHOD THEREOF

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Shengping Du, Beijing (CN); Tongshang Su, Beijing (CN); Zhengfeng Huang, Beijing (CN); Yu Yang, Beijing (CN); Yun Ma, Beijing (CN); Wen Guo, Beijing (CN); Lihua Liu, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

(*) Notice: Subject to any disclaimer, the term of this patent is extended or adjusted under 35 U.S.C. 154(b) by 896 days.

(21) Appl. No.: 16/063,924

(22) PCT Filed: Jul. 3, 2017

(86) PCT No.: PCT/CN2017/091417
§ 371 (c)(1),
(2) Date: Jun. 19, 2018

(87) PCT Pub. No.: WO2018/120730
PCT Pub. Date: Jul. 5, 2018

(65) Prior Publication Data
US 2021/0202583 A1 Jul. 1, 2021

(30) Foreign Application Priority Data
Dec. 27, 2016 (CN) .......................... 201611228190.8

(51) Int. Cl.
*H01L 27/32* (2006.01)
*G02F 1/1362* (2006.01)
(Continued)

(52) U.S. Cl.
CPC .......... *H01L 27/322* (2013.01); *G02F 1/1368* (2013.01); *G02F 1/136222* (2021.01); *H01L 27/3246* (2013.01); *H01L 51/56* (2013.01)

(58) Field of Classification Search
CPC ... H01L 27/322; H01L 27/3246; H01L 51/56; G02F 1/136222; G02F 1/1368
(Continued)

(56) References Cited

U.S. PATENT DOCUMENTS

2006/0163565 A1* 7/2006 Park .................... H01L 27/1214
257/40
2010/0181557 A1* 7/2010 Sun ..................... H01L 51/5234
257/40
(Continued)

FOREIGN PATENT DOCUMENTS

CN 1921142 A 2/2007
CN 103258793 A 8/2013
(Continued)

OTHER PUBLICATIONS

International Search Report and Written Opinion dated Sep. 19, 2017; PCT/CN2017/091417.

*Primary Examiner* — Dzung Tran

(57) ABSTRACT

A display substrate and a manufacturing method thereof are disclosed. The display substrate is divided to have a non-pixel region and a color pixel region. The manufacturing method includes: forming a thin film transistor (TFT) on a base substrate in the non-pixel region; forming a passivation layer on the TFT; forming a color filter on the passivation layer in the color Pixel region; forming a planarization layer on the passivation layer and the color filter; thinning a thickness of a portion of the planarization layer located in the color pixel region; and forming a display electrode on the planarization layer and connecting the display electrode to a drain electrode of the TFT through a via hole.

9 Claims, 7 Drawing Sheets

(51) Int. Cl.
*G02F 1/1368* (2006.01)
*H01L 51/56* (2006.01)
(58) Field of Classification Search
USPC .......................................................... 257/40
See application file for complete search history.

(56) References Cited

U.S. PATENT DOCUMENTS

| | | | |
|---|---|---|---|
| 2010/0244005 A1* | 9/2010 | Gyoda | H01L 51/529 |
| | | | 257/40 |
| 2011/0114991 A1* | 5/2011 | Lee | H01L 51/5246 |
| | | | 257/100 |
| 2014/0042443 A1* | 2/2014 | Yamazaki | H01L 29/7869 |
| | | | 257/57 |
| 2014/0138668 A1* | 5/2014 | You | H01L 51/5259 |
| | | | 257/40 |
| 2014/0175394 A1 | 6/2014 | Kum et al. | |
| 2015/0340415 A1 | 11/2015 | Qi et al. | |
| 2016/0087247 A1 | 3/2016 | Kim | |
| 2016/0178945 A1 | 6/2016 | Ryu et al. | |

FOREIGN PATENT DOCUMENTS

| | | |
|---|---|---|
| CN | 103887440 A | 6/2014 |
| CN | 105448954 A | 3/2016 |
| CN | 106783883 A | 5/2017 |
| CN | 206293440 U | 6/2017 |

\* cited by examiner

DISPLAY SUBSTRATE AND MANUFACTURING METHOD THEREOF

TECHNICAL FIELD

Embodiments of the present disclosure relate to a display substrate and a manufacturing method thereof.

BACKGROUND

COA (Color Filter On Array) is the technology of directly preparing a color filter onto an array substrate, and is advantageous in that it can increase an aperture ratio, improve a contrast ratio of a product, eliminate an issue of alignment between a color filter substrate and the array substrate, and also reduce a difficulty in manufacturing a liquid crystal cell.

FIG. 1 is a structural diagram illustrating an existing COA display substrate. As illustrated in FIG. 1, the COA display substrate includes a base substrate 1, a thin film transistor (TFT) 2 formed on the base substrate 1, a passivation layer 4 covering the TFT 2 and the base substrate 1, a color filter 12/13/14 located on the passivation layer 4, a planarization layer 5 covering the color filter 12/13/14 and the passivation layer 4, and a display electrode 7 located on the planarization layer 5 to be corresponding to a pixel region 10; the display electrode 7 is connected to a corresponding TFT 2 through a via hole.

As it can be seen from FIG. 1, because the color filter 12/13/14 is existed in the pixel region 10, a height of a portion of the planarization layer 5 located in the pixel region 10 is apparently greater than that of a portion of the planarization layer 5 located in a non-pixel region 9, which results in a poor planarization effect and affects subsequent preparing processes of other structures. In addition, during preparing a display electrode 7, a relatively larger height difference H may be occurred between the display electrode 7 and a drain electrode (the height difference is approximately equal to a difference between a film thickness of the drain electrode and a sum of film thicknesses of the passivation layer, the color filter and the planarization layer located on the color filter) because of the planarization layer 5 having a relatively greater film thickness located on the color filter 12/13/14. When the display electrode 7 is connected to the drain electrode through the via hole, a portion of the display electrode 7 located in the via hole is likely to be broken, resulting in a poor connection between the display electrode 7 and the drain electrode.

Thus it can be seen, technical problems that are urgent to be solved by those skilled in the art is how to improve a flatness of the planarization layer and how to avoid the poor connection between the display electrode and the drain electrode.

SUMMARY

In order to solve at least one of the above-mentioned technical problems in the existing technology, at least one embodiment of the present disclosure provides a display substrate and a manufacturing method thereof, which can improve the flatness of the planarization layer and also prevent the display electrode from breaking.

In order to achieve the objectives above, the embodiments of the present disclosure adopt technical solutions as below.

On one aspect, it provides a manufacturing method of a display substrate, the display substrate is divided to have a non-pixel region and a color pixel region, the manufacturing method of the display substrate includes:

forming a thin film transistor (TFT) in an area on a base substrate corresponding to the non-pixel region;

forming a passivation layer on the TFT;

forming a color filter in an area on the passivation layer corresponding to the color pixel region;

forming a planarization layer on the passivation layer and the color filter;

thinning a thickness of a portion of the planarization layer located in the color pixel region so that the thickness of the portion of the planarization layer located in the color pixel region is smaller than a thickness of a portion of the planarization layer located in the non-pixel region; and forming a display electrode on the planarization layer and connecting the display electrode to a drain electrode through a via hole.

Optionally, forming a planarization layer on the passivation layer and the color filter is synchronized with thinning a thickness of a portion of the planarization layer located in the color pixel region, and forming a planarization layer includes:

forming a planarization material thin film on the passivation layer and the color filter, the planarization material thin film including a completely-retained region, a partly-retained region and a non-retained region, the partly-retained region being corresponding to the color pixel region, and the non-retained region being corresponding to an area of the drain electrode;

masking and exposing the planarization material thin film by using a halftone mask; and developing the planarization material thin film having been exposed to form the planarization layer.

Optionally, the manufacturing method further includes: forming a first via hole in an area on the planarization layer corresponding to the drain electrode;

forming a passivation layer on the TFT includes:

forming a passivation material film on the TFT;

forming a display electrode on the planarization layer includes:

performing a single patterning process to the passivation material film to form a second via hole below the first via hole, with the remaining portion of the passivation material film constituting the passivation layer;

forming a transparent conductive material film on the planarization layer, in the first via hole and the second via hole; and performing a single patterning process to the transparent conductive material film to form a pattern of the display electrode, connecting the display electrode to the drain electrode through the first via hole and the second via hole.

Optionally, the manufacturing method further includes: forming a first via hole in an area on the planarization layer corresponding to the drain electrode;

forming a passivation layer on the TFT includes:

forming a passivation material film on the TFT;

performing a single patterning process to the passivation material film to form a second via hole, the second via hole being disposed corresponding to the drain electrode and connected to a first hole formed in a subsequent process, with the remaining portion of the passivation material film constituting the passivation layer;

forming a display electrode on the planarization layer includes:

forming a transparent conductive material film on the planarization layer, in the first via hole and the second via hole; and performing a single patterning process to the transparent conductive material film to form a pattern of the display electrode, connecting the display electrode to the drain electrode through the first via hole and the second via hole.

Optionally, the display substrate is an organic light-emitting diode (OLED) substrate, the display electrode is an anode, and the manufacturing method of the display substrate further includes:

forming a pixel defining layer on the planarization layer, the pixel defining layer being provided with several receiving holes, and the receiving holes being disposed corresponding to the display electrode;

forming an organic light-emitting layer in the receiving holes;

forming a cathode on the organic light-emitting layer; and forming a protective substrate on the cathode.

Optionally, the display substrate is a liquid crystal display (LCD) substrate, the display electrode is a pixel electrode, and the manufacturing method of the display substrate further includes:

forming a protective layer on the pixel electrode; and forming an alignment layer on the protective layer.

Optionally, the display substrate is further divided to have a white pixel region.

Optionally, a difference between a thickness of a portion of the planarization layer located in the non-pixel region and a thickness of a portion of the planarization layer located in the color pixel region is in a range from 2 μm to 3 μm.

Optionally, a thickness of a portion of the planarization layer located in the non-pixel region is in a range from 3 μm to 3.5 μm;

a thickness of a portion of the planarization layer located in the color pixel region is in a range from 0 μm to 1.5 μm.

Based on a same inventive concept, the embodiment of the present disclosure further provides a display substrate, the display substrate is divided to have a non-pixel region and a color pixel region, and the display substrate includes: a base substrate; a thin film transistor (TFT) formed on the base substrate and located in the non-pixel region; a passivation layer formed on the TFT; a color filter formed on the passivation layer and located in the color pixel region; a planarization layer formed on the passivation layer and the color filter, a thickness of a portion of the planarization layer located in the color pixel region being smaller than a thickness of a portion of the planarization layer located in the non-pixel region; and a display electrode formed on the planarization layer, the display electrode being connected to a drain electrode of the TFT through a via hole.

Optionally, the display substrate is an organic light-emitting diode (OLED) substrate, the display electrode is an anode, and the display substrate further includes: a pixel defining layer formed on the planarization layer, the pixel defining layer being provided with several receiving holes, the receiving holes being disposed corresponding to the display electrode, an organic light-emitting layer being formed in the receiving holes, a cathode being formed on the organic light-emitting layer; and a protective substrate formed on the cathode.

Optionally, the display substrate is a liquid crystal display (LCD) substrate, the display electrode is a pixel electrode, and the display substrate further includes: a protective layer formed on the pixel electrode; and an alignment layer formed on the protective layer.

Optionally, the display substrate is further divided to have a white pixel region.

Optionally, a difference between a thickness of a portion of the planarization layer located in the non-pixel region and a thickness of a portion of the planarization layer located in the color pixel region is in a range from 2 μm to 3 μm.

Optionally, a thickness of a portion of the planarization layer located in the non-pixel region is in a range from 3 μm to 3.5 μm;

a thickness of a portion of the planarization layer located in the color pixel region is in a range from 0 μm to 1.5 μm.

BRIEF DESCRIPTION OF THE DRAWINGS

Hereinafter, the embodiments of the present disclosure will be described more specifically in conjunction with the drawings so as to provide more definite explanations of the embodiments of the present disclosure for those ordinary skilled in the art. In the drawings.

DETAILED DESCRIPTION

In order to make objects, technical solutions and advantages of the embodiments of the present disclosure apparent, the technical solutions of the embodiments will be described in a clearly and fully understandable way in connection with the drawings related to the embodiments of the invention. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Hereinafter the display substrate and the manufacturing method thereof will be described more specifically with reference to the drawings, in order to provide those skilled in the art with better understanding of the technical solutions of the present disclosure.

Figure 1:
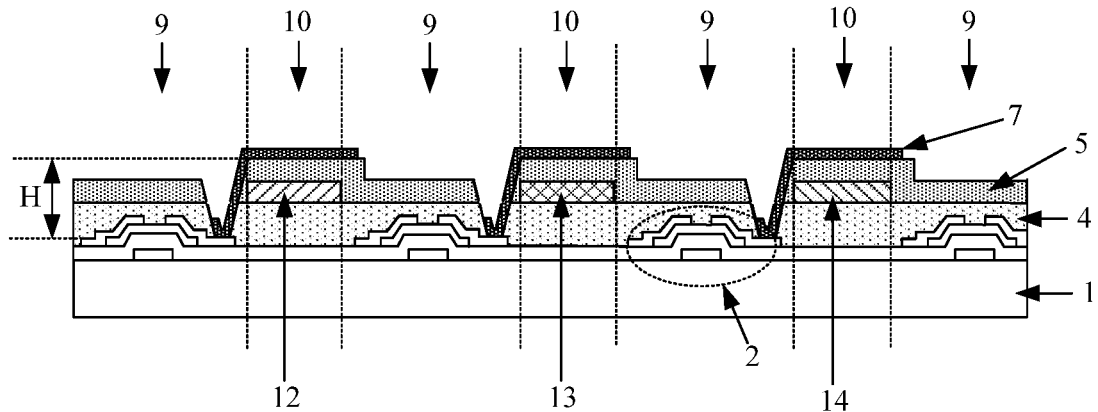
FIG. 1 is a schematic diagram illustrating an existing COA display substrate.
Figure 2:
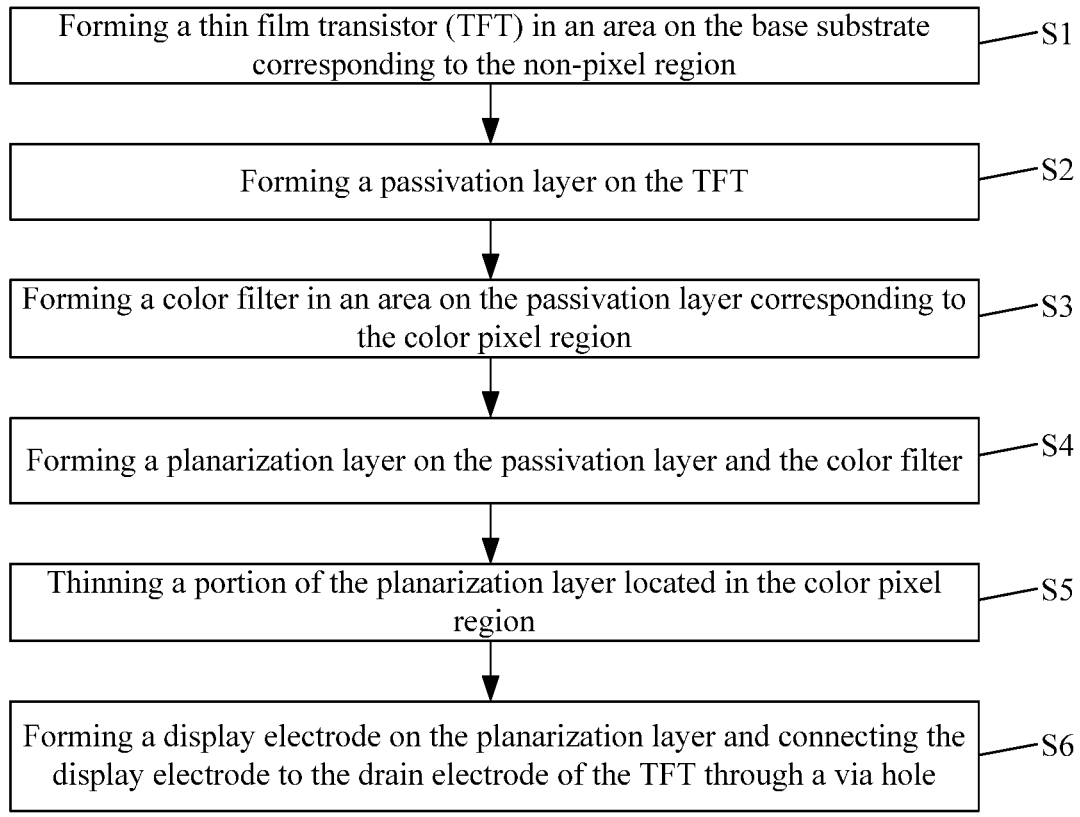
FIG. 2 is a flow chart illustrating a manufacturing method of a display substrate provided by a first embodiment of the present disclosure.
Figure 3:
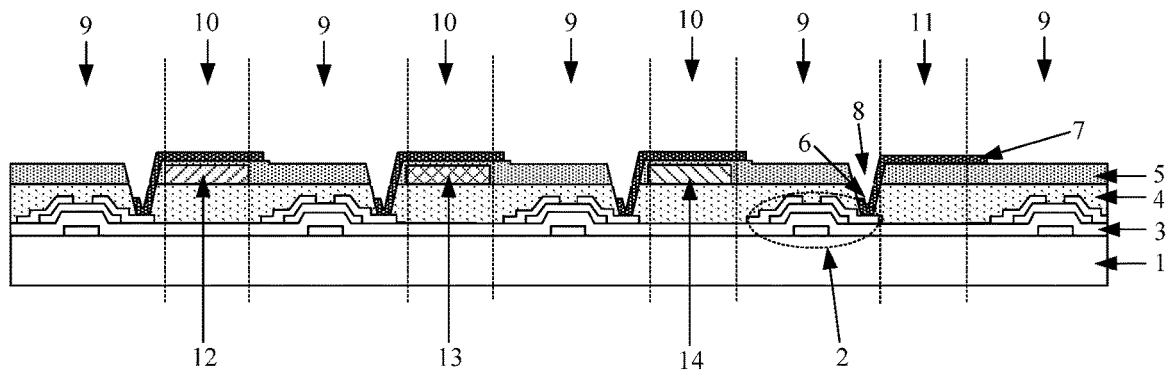
FIG. 3 is a schematic diagram illustrating a display substrate manufactured by the manufacturing method as illustrated in FIG. 2.

FIG. 2 is a flow chart illustrating a manufacturing method of a display substrate provided by a first embodiment of the present disclosure; FIG. 3 is a schematic diagram illustrating a display substrate manufactured by the manufacturing method as illustrated in FIG. 2; and FIGS. 4a-4g are schematic diagrams illustrating intermediate structures obtained during manufacturing the display substrate as illustrated in FIG. 3. As illustrated in FIGS. 2-4g, the display substrate is divided to have a non-pixel region 9 and a color pixel region 10. The non-pixel region 9 refers to a region in which no pixel is used for display, and the color pixel region 10 refers to a region in which pixels are used for colored display. The manufacturing method of the display substrate includes steps S1-S6 as below.

Step S1, forming a thin film transistor (TFT) in an area on the base substrate corresponding to the non-pixel region.

Figure 4A:
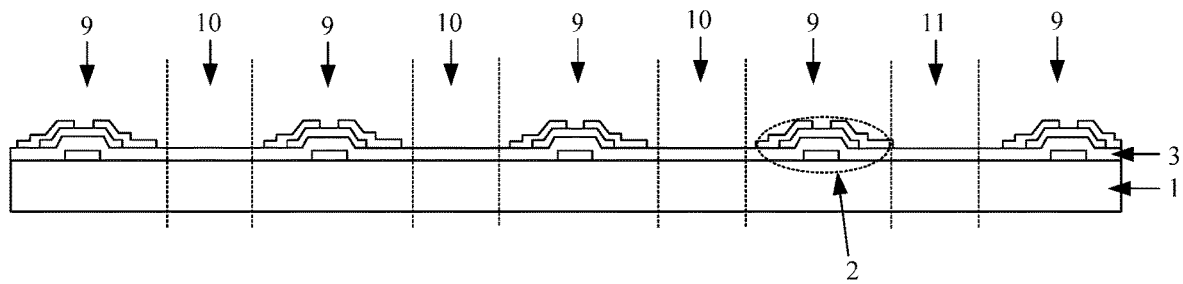
FIGS. 4a-4g are schematic diagrams illustrating intermediate structures obtained during manufacturing the display substrate as illustrated in FIG. 3.

As illustrated in FIG. 4a, a TFT 2 is formed on an area on the base substrate 1 corresponding to the non-pixel region 9. The base substrate 1 may be a glass substrate or a resin material substrate. The TFT 2 may be manufactured by any method of manufacturing a TFT. For example, the TFT 2 may include a gate electrode, an active layer, a source electrode and a drain electrode: a gate insulating layer 3 is disposed between the gate electrode and the active layer.

Those skilled in the art should be appreciated that, although not illustrated, a gate line and a data line may be manufactured along with the TFT 2.

Step S2, forming a passivation layer on the TFT.

Figure 4B:
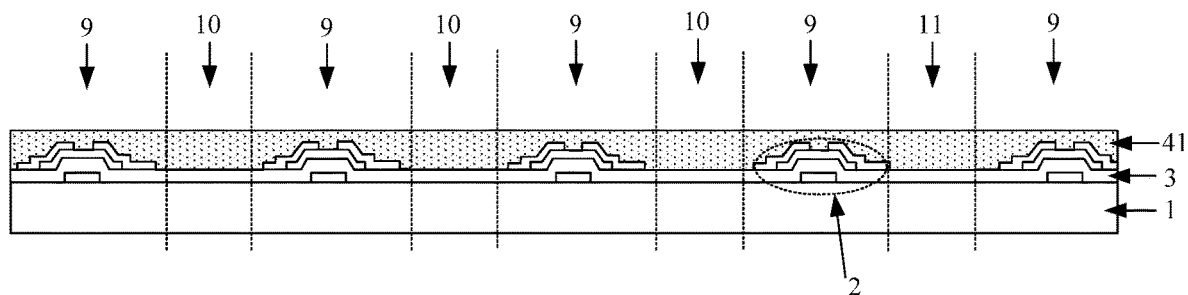

As illustrated in FIG. 4b, a passivation material film 41 may be formed on the TFT 2 and the gate insulating layer 3. Optionally, the passivation material is at least one of SiOx, SiNx and SiOxNy.

It should be explained that, in the embodiment of the present disclosure, a film may be formed by depositing, coating, sputtering and the like. For example, in the step S2, the passivation material film 41 may be formed by using a plasma enhanced chemical vapor deposition (PECVD) method.

Step S3, forming a color filter in an area on the passivation layer corresponding to the color pixel region.

Figure 4C:
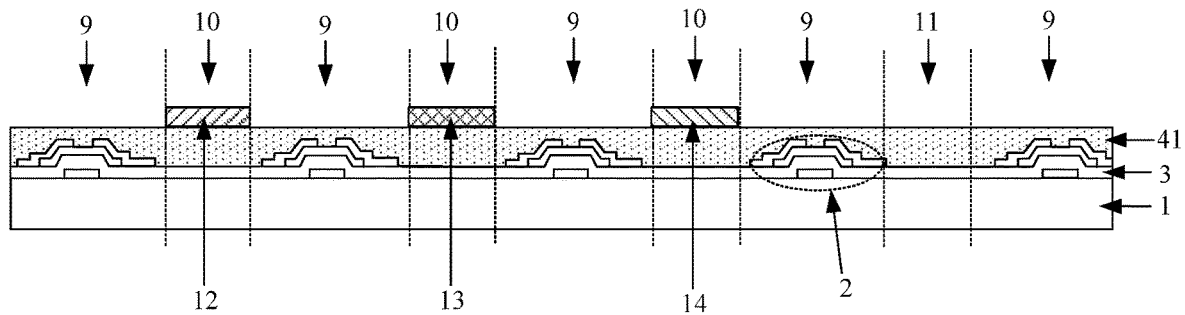

As illustrated in FIG. 4c, in the present embodiment, optionally, the color pixel region 10 may include a red pixel region, a green pixel region and a blue pixel region. The color filter 12/13/14 (also referred to as CF) may include, for example, a red color filter pattern 12, a green color filter 13 and a blue color filter 14. In step S3, the red color filter pattern 12 may be prepared in the red pixel region by using any manufacturing method of red color filter pattern, the green color filter pattern 13 may be prepared in the green pixel region, and the blue color filter pattern 14 may be prepared in the blue pixel region.

Step S4, forming a planarization layer on the passivation layer and the color filter.

Figure 4D:
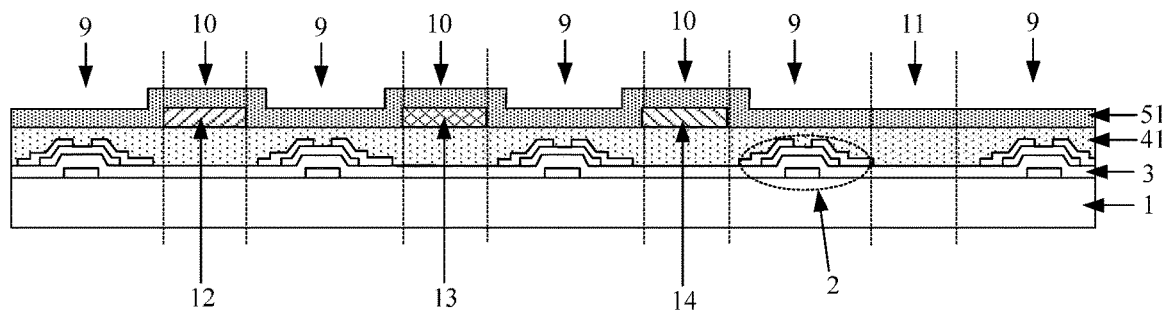
Figure 4E:
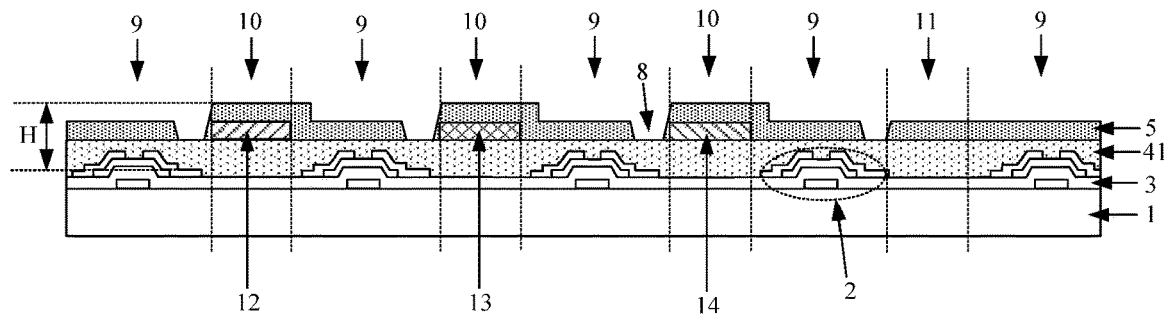

As illustrated in FIG. 4d and FIG. 4e, for example, a planarization material film 51 may be formed on the passivation layer 4 and the color filter 12/13/14, and the planarization material film 51 may be patterned to form a first via hole 8. The first via hole 8 is located right above the drain electrode of the TFT 2, and the remaining portion of the planarization material film constitutes the planarization layer 5. Optionally, a thickness of the planarization material film 51 may be in a range from 3 μm to 5 μm.

For example, the planarization material may be a resin material. The planarization material film 51 may be masked and exposed by using a preset mask, and then developed to remove the planarization material located right above the drain electrode, so as to form the first via hole 8.

In the present embodiment, optionally, the display substrate further includes a white pixel region 11, apart from the non-pixel region 9 and the color pixel region 10. The existence of the white pixel region 11 can effectively increase a brightness of the display panel and decrease an overall power consumption. In the present embodiment, a portion of the planarization layer 5 filled in a blank area can be used as a white color filter, so that an additional patterning process for the white color filter can be omitted.

After the step S4, an upper surface height of the portion of the planarization layer 5 located in the color pixel region 10 is apparently greater than that of the portion located in the non-pixel region 9 and that of the portion located in the white pixel region 11. That is to say, the planarization effect is poor.

Step S5, thinning a portion of the planarization layer located in the color pixel region.

Figure 4F:
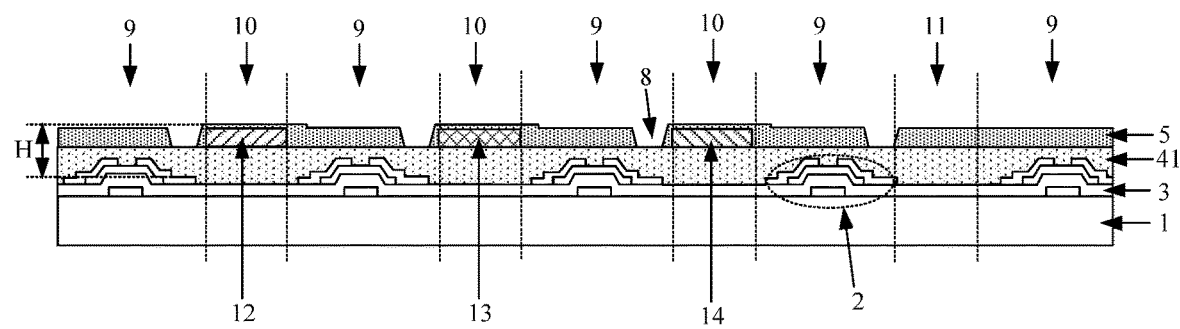

As illustrated in FIG. 4f, in the step S5, by thinning the portion of the planarization layer 5 located in the color pixel region 10 to reduce an upper surface height of this portion, the thickness of the portion of the planarization layer located in the color pixel region 10 is smaller than that of the portion located in the non-pixel region 9; in this way, the flatness of the planarization layer 5 can be effectively improved.

Optionally, after the step S5, a difference between a thickness of the portion of the planarization layer 5 located in the non-pixel region 9 and a thickness of the portion of the planarization layer 5 located in the color pixel region 10 may be in a range from 2 μm to 3 μm.

For example, after the step S5, the thickness of the portion of the planarization layer 5 located in the non-pixel region 9 may be in a range from 3 μm to 3.5 μm; and the thickness of the portion of the planarization layer 5 located in the color pixel region 10 may be in a range from 0 μm to 1.5 μm.

Step S6, forming a display electrode on the planarization layer, and connecting the display electrode to the drain electrode of the TFT through a via hole.

Figure 4G:
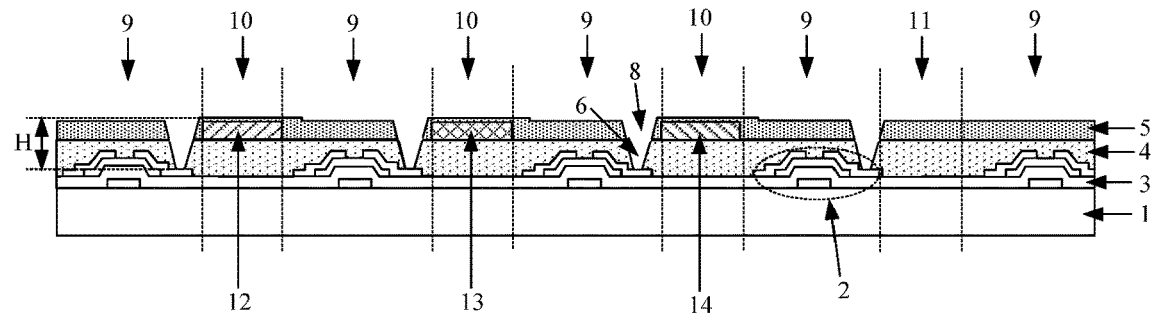

As illustrated in FIG. 3 and FIG. 4g, first of all, performing a singe patterning process to the passivation material film 41 to form a second via hole 6 below the first via hole 8, with the remaining portion of the passivation material film 41 constituting the passivation layer 4; subsequently, forming a transparent conductive material film on the planarization layer 5, in the first via hole 8 and the second via hole 6; subsequently, performing a single patterning process to the transparent conductive material film to form a pattern of display electrode 7 and connecting the display electrode 7 to the drain electrode through the first via hole 8 and the second via hole 6. It should be explained that, a single patterning process in the embodiment of the present disclosure includes steps of coating a photoresist, exposing, developing, etching, peeling off the photoresist and the like.

Because the portion of the planarization layer 5 located in the color pixel region 10 is thinned in step S5, that is, the thickness of the portion of the planarization layer 5 located above the color filter is reduced, the height difference between the display electrode 7 as formed in step S6 and the drain electrode is decreased, and the risk of the portion of the display electrode 7 located in a via hole being broken when the display electrode 7 is connected to the drain electrode through the via hole can be effectively reduced.

It can be seen from the above that, the technical solutions of the embodiments of the present disclosure can effectively improve the flatness of the planarization layer 5 and also reduce the risk of the display electrode 7 being broken.

It should be explained that, the embodiment of the present disclosure is not limited to first forming the first hole 8 in the planarization material film 51 and then forming the second via hole 6 in the passivation material film 41. For example, in some other embodiments, it's also possible to firstly form the second via hole 6 in the passivation material film 41 and then form the first hole 8 in the planarization material film 51.

Figure 5:
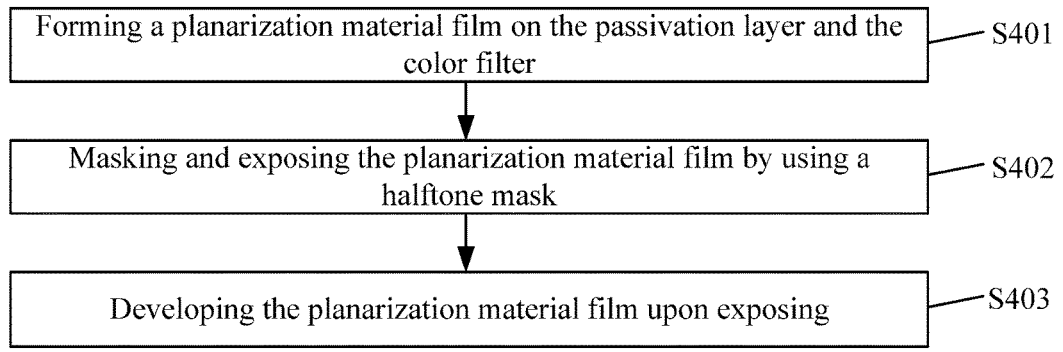
FIG. 5 is a flow chart illustrating forming a first via hole by using a halftone mask and thinning a portion of a planarization layer located in a color pixel region.
Figure 6:
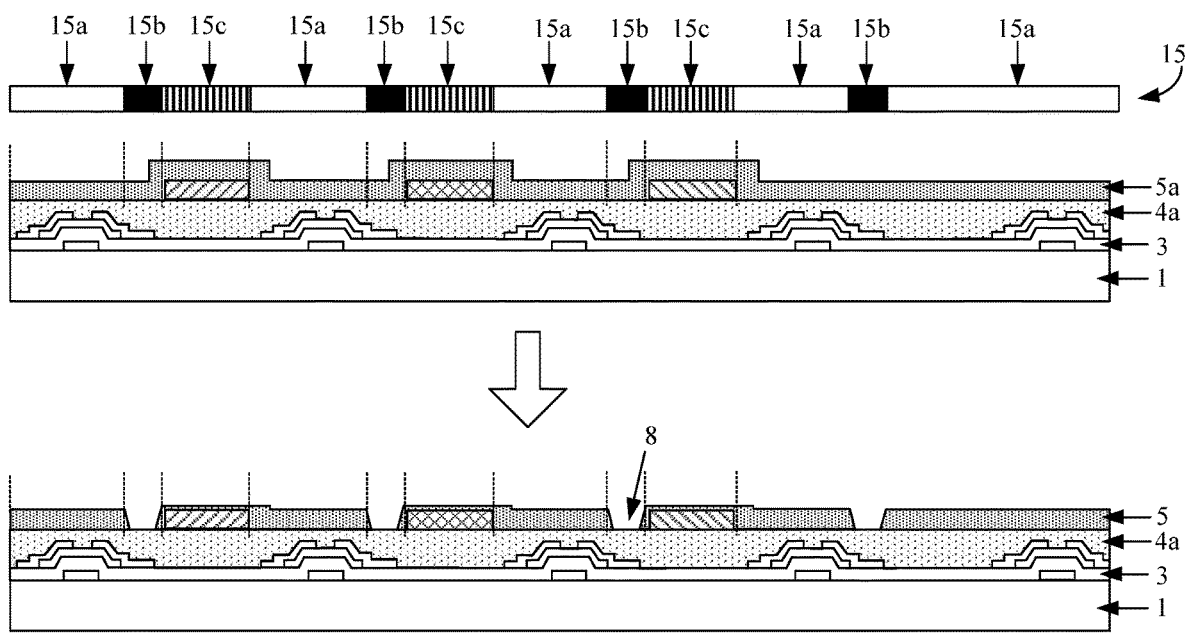
FIG. 6 is a schematic diagram illustrating patterning a planarization material film by using a halftone mask.

For example, in the step S2, it's possible to firstly form a passivation material film 41 on the TFT 2 and the gate insulating layer 3, and then performing a single patterning process to the passivation material film 41 to form the second via hole 6, so that the second via hole 6 is disposed to be corresponding to the drain electrode and is connected to the first via hole 8 formed in a subsequent process, with the remaining portion of the passivation material film 41 constituting the passivation layer 4. In such case, in the step S6, it no longer needs to process the passivation material film 41, but can directly form a transparent conductive material film and then perform a single patterning process to the transparent conductive material film. In addition, the embodiment of the present disclosure is also possible to thin the portion of the planarization layer 5 located in the color pixel region 10 at the same time when forming the first hole 8 through a single process, that is, the step S4 may be synchronized with the step S5. FIG. 5 is a flow chart illustrating forming a first via hole by using a halftone mask and thinning a portion of a planarization layer located in a color pixel region; and FIG. 6 is a schematic diagram illustrating patterning a planarization material film by using a halftone mask. As illustrated in FIG. 5 and FIG. 6, forming the planarization layer 5 may include steps S401-S403 as below.

Step S401, forming a planarization material film on the passivation layer and the color filter.

As illustrated in FIG. 6, description will be given with reference to the case where the planarization material is an organic resin material used as a negative photoresist, by way of example. The planarization material film 51 includes a completely-retained region, a partly-retained region and a non-retained region; the partly-retained region corresponds to the color pixel region 10, and the non-retained region (corresponding to the drain electrode) corresponds to an area in which the first via hole 8 is to be formed.

Step S402, masking and exposing the planarization material film by using a halftone mask.

Still referring to FIG. 6, the halftone mask 15 includes a complete transmittance region 15*a*, a partial transmittance region 15*c* and a non-transmittance region 15*b*; the complete transmittance region 15*a* corresponds to the completely-retained region, the partial transmittance region 15*c* corresponds to the partly-retained region, and the non-transmittance region 15*b* corresponds to the non-retained region.

Step S403, developing the planarization material film upon exposing.

The remaining portion of the planarization material film just constitutes the planarization layer 5, in which the planarization material in the completely-retained region is completely retained, the planarization material in the non-retained region is completely removed to form the first via hole 8, and the planarization material in the color pixel region 10 is partly retained so that a reduced thickness is achieved.

In the present embodiment, by using a single patterning process, forming the first via hole 8 at the same time when thinning the portion of the planarization layer 5 located in the color pixel region 10, which can effectively reduce the number of processing steps and shorten a time period of manufacturing the display substrate.

It should be explained that, the planarization material in the present embodiment may also be an organic resin material used as a positive photoresist, which can also achieve forming the first via hole 8 at the same time when thinning the portion of the planarization layer 5 located in the color pixel region 10 through a single patterning process. Detailed description will not be repeated herein.

Based on the same inventive concept, the embodiment of the present disclosure further provides a display substrate manufactured by the above-mentioned manufacturing method. As illustrated in FIG. 3, the display substrate is divided to have a non-pixel region 9 and a color pixel region 10, and includes: a base substrate 1; a thin film transistor (TFT) 2 formed on the base substrate 1 and located in the non-pixel region 9; a passivation layer 4 formed on the TFT 2; a color filter 12/13/14 formed on the passivation layer 4 and located in the color pixel region 10; a planarization layer 5 formed on the passivation layer 4 and the color filter 12/13/14; and a display electrode 7 formed on the planarization layer 5. A portion of the planarization layer 5 located in the color pixel region 10 has a thickness smaller than that of a portion located in the non-pixel region 9, and the display electrode 7 is connected to a drain electrode of the TFT 2 through a via hole.

Optionally, a difference between the thickness of the portion of the planarization layer 5 located in the non-pixel region 9 and the thickness of the portion of the planarization layer 5 located in the color pixel region 10 is in a range from 2 μm to 3 μM.

Optionally, the thickness of the portion of the planarization layer located in the non-pixel region 9 is in a range from 3 μm to 3.5 μm; the thickness of the portion of the planarization layer located in the color pixel region 10 is in a range from 0 μm to 1.5 μm.

As compared with the existing technology, the technical solution of the embodiment of the present disclosure performs a thinning process to the portion of the planarization layer 5 located in the color pixel region 10 so that the thickness of the portion of the planarization layer 5 located in the color pixel region 10 is smaller than that of the portion located in the non-pixel region 9, thereby effectively improving the flatness of the planarization layer 5. In addition, because the portion of the planarization layer 5 located above the color filter 12/13/14 is reduced, the height difference H between the display electrode 7 and the drain electrode is decreased, which effectively lowers a risk of a portion of the display electrode 7 located in a via hole being broken when the display electrode 7 is connected to the drain electrode through the via hole.

Optionally, a material of the planarization layer 5 includes an organic resin material.

Optionally, the display substrate is further divided to have a white pixel region 11.

Figure 7:
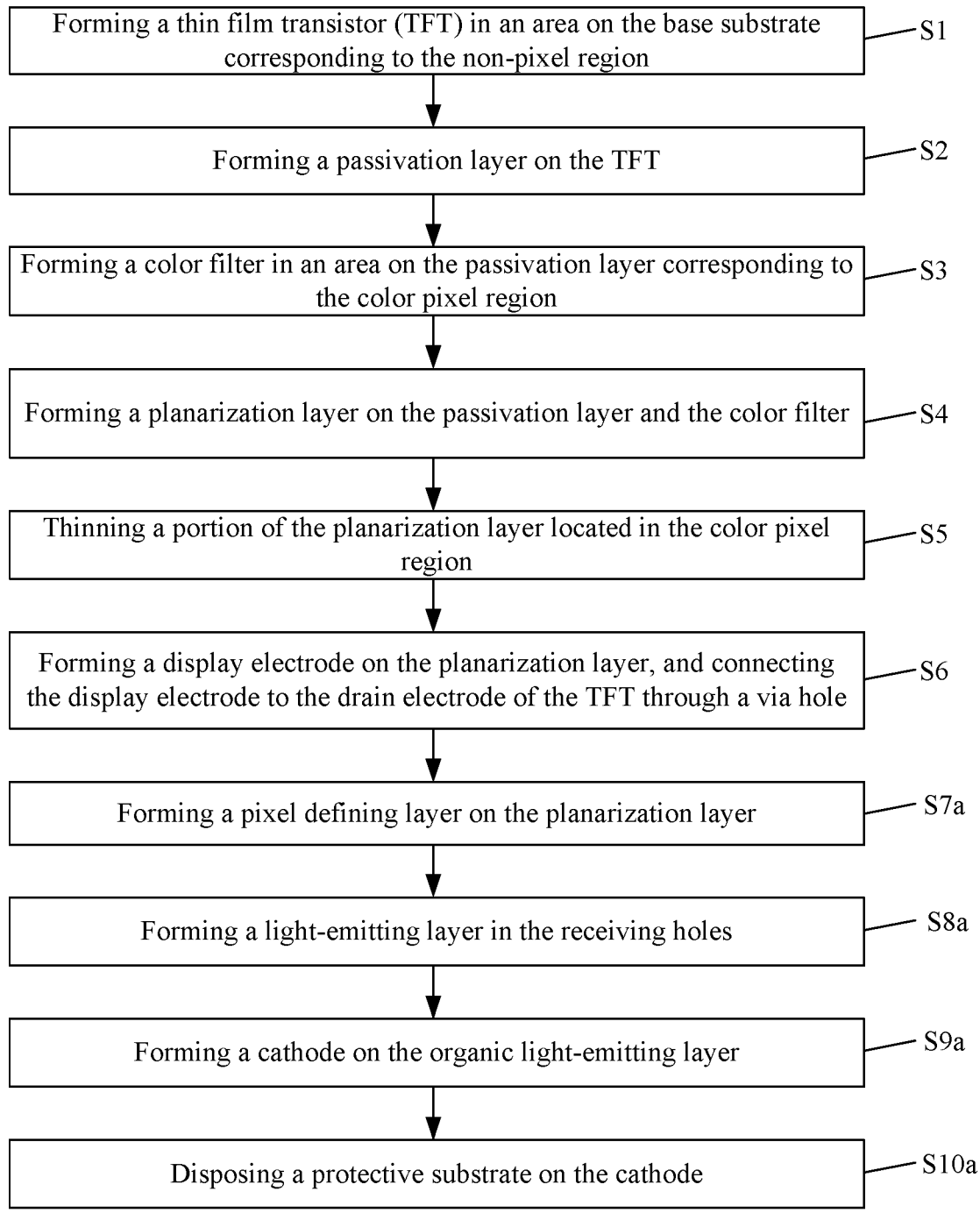
FIG. 7 is a flow chart illustrating a manufacturing method of a display substrate provided by a second embodiment of the present disclosure.
Figure 8:
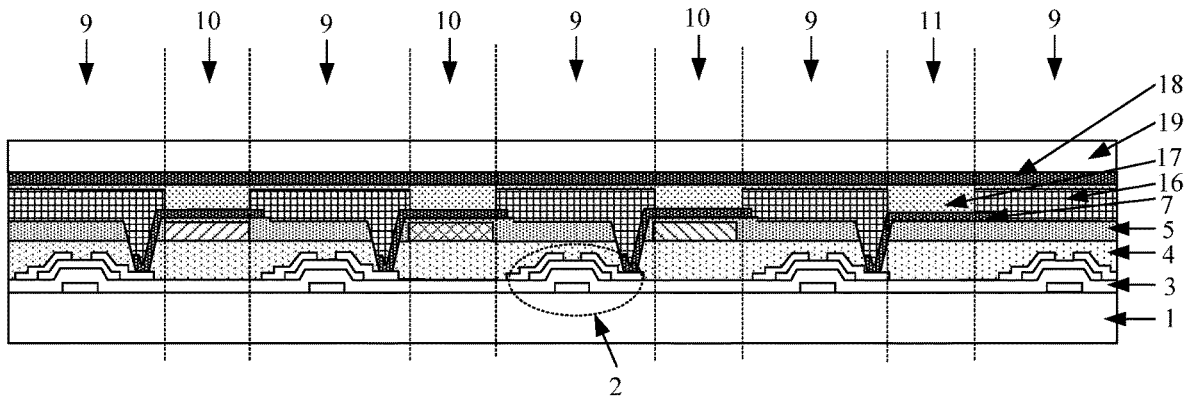
FIG. 8 is a schematic diagram illustrating a display substrate manufactured by the manufacturing method as illustrated in FIG. 7.

FIG. 7 is a flow chart illustrating a manufacturing method of a display substrate provided by a second embodiment of the present disclosure; FIG. 8 is a schematic diagram illustrating a display substrate manufactured by the manufacturing method as illustrated in FIG. 7. As illustrated in FIG. 7 and FIG. 8, the display substrate is an organic light-emitting diode (OLED) substrate, and the display electrode 7 is an anode. The manufacturing method of the display substrate in the present embodiment further includes additional steps S7a-S10a, apart from the steps S I-S6 in the first embodiment above. As for steps S1-S6, reference may be made to the contents in the first embodiment. Hereinafter only steps S7a-S10a are described by way of example.

Step S7a, forming a pixel defining layer on the planarization layer.

For example, first of all, forming a pixel defining material film on the planarization layer 5, the pixel defining material may be an organic resin material; then patterning the pixel defining material film to form several receiving holes disposed corresponding to the display electrode 7, with the remaining portion of the pixel defining material film constituting the pixel defining layer 16.

Step S8a, forming a light-emitting layer in the receiving holes.

In the step S8a, for example, an organic light-emitting solution may be formed in the receiving holes by using ink jet printing technology, and then the organic light-emitting solution may be dried to form a light-emitting layer 17. In the present embodiment, the light-emitting layer 17 emits white light under a voltage effect.

It should be explained that, during actual preparing process, in order to ensure that an amount of the organic light-emitting solution in each of the receiving holes is consistent and also to guarantee the flatness of the cathode 18 formed later, the organic light-emitting solution is fully filled in each of the receiving holes and existed over the entire upper surface of the pixel defining layer 16, and then is dried so that each of the receiving holes is fully filled with an organic light-emitting material and the upper surface of the pixel defining layer 16 is provided with a super-thinned layer of organic light-emitting material.

Step S9a, forming a cathode on the organic light-emitting layer.

For example, a transparent conductive material film is formed on the organic light-emitting layer 17, and the transparent conductive material film constitutes the cathode 18.

Step S10a, disposing a protective substrate on the cathode.

In the step S10a, for example, the protective substrate 19 may be a glass substrate or a resin material substrate configured to protect the cathode 18.

It should be explained that, in the present embodiment, in order to improve the luminous property of OLED, it's also possible to form a hole transmission layer and an electron barrier layer between the anode 7 and the organic light-emitting layer 17, and form an electron transmission layer and a hole barrier layer between the cathode 18 and the organic light-emitting layer 17. Based on the same inventive concept, the embodiment of the present disclosure provides a display substrate manufactured by using the above-mentioned manufacturing method. As illustrated in FIG. 8, the display substrate is an OLED substrate, the display substrate not only includes a base substrate 1, a TFT 2, a passivation layer 4, a planarization layer 5, a color filter 12/13/14 and a display electrode 7, but also includes a pixel defining layer 16, an organic light-emitting layer 17 and a cathode 18.

The pixel defining layer 16 is located on the planarization layer 5, and is provided with several receiving holes disposed corresponding to the display electrode 7; the organic light-emitting layer 17 is located in the receiving holes, and the cathode 18 is located on the organic light-emitting layer 17.

Figure 9:
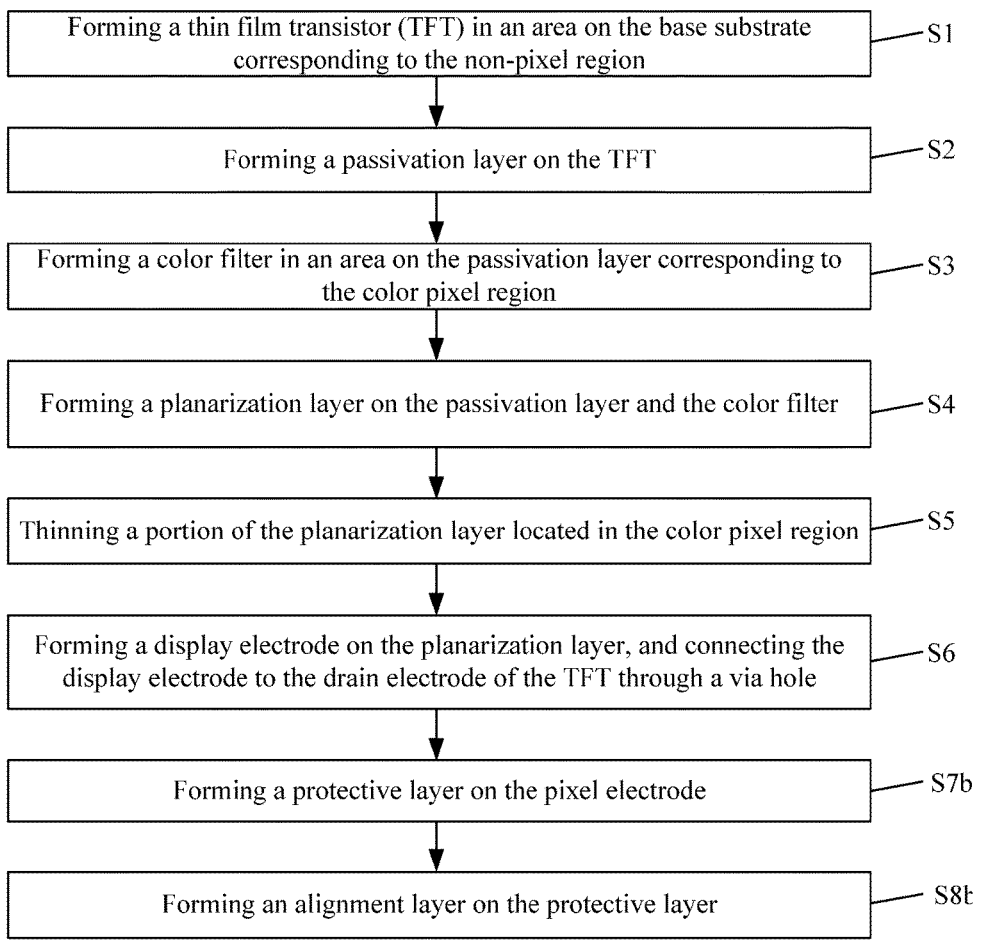
FIG. 9 is a flow chart illustrating a manufacturing method of a display substrate provided by a third embodiment of the present disclosure.
Figure 10:
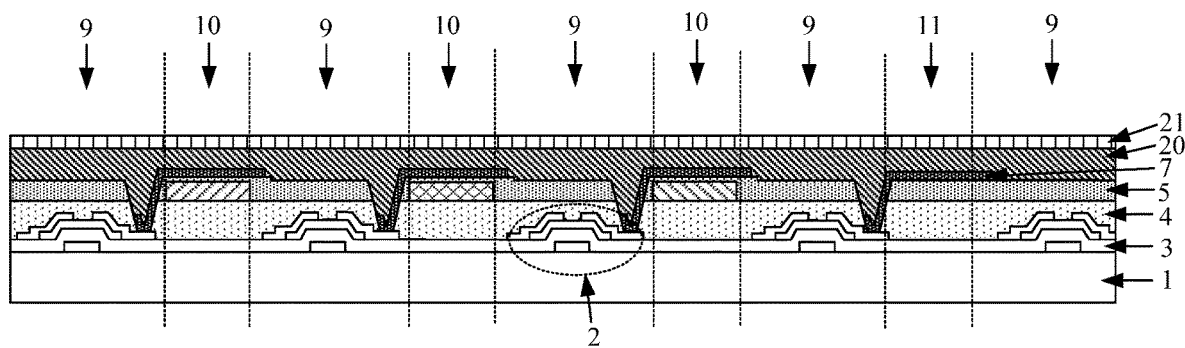
FIG. 10 is a schematic diagram illustrating a display substrate manufactured by the manufacturing method as illustrated in FIG. 9.

FIG. 9 is a flow chart illustrating a manufacturing method of a display substrate provided by a third embodiment of the present disclosure; and FIG. 10 is a schematic diagram illustrating a display substrate manufactured by the manufacturing method as illustrated in FIG. 9. As illustrated in FIG. 9 and FIG. 10, the display substrate is a liquid crystal display (LCD) substrate (an array substrate in a LCD panel), and the display electrode 7 is a pixel electrode. The manufacturing method of the display substrate further includes additional steps S7b and S8b, apart from the steps S1-S6 in the first embodiment above. As for steps S1-S6, reference may be made to the contents in the first embodiment. Hereinafter only steps S7b and S8b are described by way of example.

Step S7b, forming a protective layer on the pixel electrode.

Forming a protective material film on the planarization layer 5, the protective material may be a transparent organic resin material, and the protective material film constitutes a protective layer 20.

Step S8b, forming an alignment layer on the protective layer.

First of all, forming an alignment material film on the protective layer 20; then a film orientation process or a photo-alignment process may be performed to the alignment material film to form a pre-titled angle on a surface of the alignment material film; the remaining portion of the alignment material film constitutes an alignment layer 21.

Based on the same inventive concept, the embodiment of the present disclosure further provides a display substrate manufactured by using the manufacturing method above. Referring to FIG. 10, the display substrate is a LCD substrate which includes not only a base substrate 1, a TFT 2, a passivation layer 4, a planarization layer 5, a color filter 12/13/14 and a display electrode 7 but also includes a protective layer 20 and an alignment layer 21.

The protective layer 20 is located on the planarization layer 5, and the alignment layer 21 is located on the protective layer 20.

It should be understood that, the foregoing are merely illustrative embodiments for explaining the principles of the present disclosure without limiting the present disclosure thereto. Without departing from the spirit and essence of the present disclosure, various variations and improvements may be made by one skilled in the art, and these variations and improvements shall also be within the protection scope of the present disclosure.

The application claims priority of Chinese patent application No. 201611228190.8 filed with the SIPO on Dec. 27, 2016, titled "DISPLAY SUBSTRATE AND MANUFACTURING METHOD THEREOF", the entire disclosure of which is incorporated herein by reference as part of the present application.

What is claimed is:

1. A manufacturing method of a display substrate, the display substrate being divided to have a non-pixel region and a color pixel region, the manufacturing method of the display substrate comprising:
  forming a thin film transistor (TFT) on a base substrate in the non-pixel region;
  forming a passivation layer on the TFT;
  forming a color filter on the passivation layer in the color pixel region;

forming a planarization layer on the passivation layer and the color filter;

thinning a thickness of a portion of the planarization layer located in the color pixel region so that the thickness of the portion of the planarization layer located in the color pixel region is smaller than a thickness of a portion of the planarization layer located in the non-pixel region, the portion of the planarization layer located in the color pixel region is a thinner planarization layer and the thickness of the portion of the planarization layer located in the color pixel region is in a range from about 0 μm to about 1.5 μm, and a thickness of a portion of the planarization layer located in the non--pixel region is in a range from about 3 μm to about 3.5 μm: and forming a display electrode on the planarization layer and connecting the display electrode to a drain electrode of the TFT through a via hole.

2. The manufacturing method of a display substrate according to claim 1, wherein forming a planarization layer on the passivation layer and the color filter is synchronized with thinning a thickness of a portion of the planarization layer located in the color pixel region, wherein forming a planarization layer comprises:

forming a planarization material thin film on the passivation layer and the color filter, the planarization material thin film comprising a completely-retained region, a partly-retained region and a non-retained region, the partly-retained region being corresponding to the color pixel region, and the non-retained region being corresponding to an area of the drain electrode;

masking and exposing the planarization material thin film by using a halftone mask; and developing the planarization material thin film upon exposing to form the planarization layer.

3. The manufacturing method of a display substrate according to claim 1, further comprising: forming a first via hole in an area on the planarization layer corresponding to the drain electrode, wherein forming a passivation layer on the TFT comprises:

forming a passivation material film on the TFT, forming a display electrode on the planarization layer comprises:

performing a single patterning process to the passivation material film to form a second via hole below the first via hole, with the remaining portion of the passivation material film constituting the passivation layer;

forming a transparent conductive material film on the planarization layer in the first via hole and the second via hole; and performing a single patterning process to the transparent conductive material film to form a pattern of the display electrode, connecting the display electrode to the drain electrode through the first via hole and the second via hole.

4. The manufacturing method of a display substrate according to claim 1, further comprising: forming a first via hole in an area on the planarization layer corresponding to the drain electrode, wherein forming a passivation layer on the TFT comprises:

forming a passivation material film on the TFT; and performing a single patterning process to the passivation material film to form a second via hole, the second via hole being disposed corresponding to the drain electrode and communicated with the first hole formed in a subsequent process, with the remaining portion of the passivation material film constituting the passivation layer, forming a display electrode on the planarization layer comprises:

forming a transparent conductive material film on the planarization layer in the first via hole and the second via hole; and performing a single patterning process to the transparent conductive material film to form a pattern of the display electrode, connecting the display electrode to the drain electrode through the first via hole and the second via hole.

5. The manufacturing method of a display substrate according to claim 1, wherein the display substrate is an organic light-emitting diode (OLED) substrate, the display electrode is an anode, and the manufacturing method of the display substrate further comprises:

forming a pixel defining layer on the planarization layer, the pixel defining layer being provided with several receiving holes, and the receiving holes being disposed corresponding to the display electrode;

forming an organic light-emitting layer in the receiving holes;

forming a cathode on the organic light-emitting layer; and forming a protective substrate on the cathode.

6. The manufacturing method of a display substrate according to claim 1, wherein the display substrate is a liquid crystal display (LCD) substrate, the display electrode is a pixel electrode, and the manufacturing method of the display substrate further comprises:

forming a protective layer on the pixel electrode; and forming an alignment layer on the protective layer.

7. The manufacturing method of a display substrate according to claim 1, wherein the display substrate is further divided to have a white pixel region.

8. The manufacturing method of a display substrate according to claim 1, wherein a difference between a thickness of a portion of the planarization layer located in the non-pixel region and a thickness of a portion of the planarization layer located in the color pixel region is in a range from 2 μm to 3 μm.

9. The manufacturing method of a display substrate according to claim 2. wherein a difference between a thickness of a portion of the planarization layer located in the non-pixel region and a thickness of a portion of the planarization layer located in the color pixel region is in a range from about 2 μm to about 3 μm.

* * * * *